(12) United States Patent
Baluja et al.

(10) Patent No.: US 8,911,553 B2
(45) Date of Patent: Dec. 16, 2014

(54) QUARTZ SHOWERHEAD FOR NANOCURE UV CHAMBER

(75) Inventors: Sanjeev Baluja, Campbell, CA (US); Juan Carlos Rocha-Alvarez, San Carlos, CA (US); Alexandros T. Demos, Fremont, CA (US); Thomas Nowak, Cupertino, CA (US); Jianhua Zhou, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 638 days.

(21) Appl. No.: 13/248,656

(22) Filed: Sep. 29, 2011

(65) Prior Publication Data

US 2012/0090691 A1  Apr. 19, 2012

Related U.S. Application Data

(60) Provisional application No. 61/394,711, filed on Oct. 19, 2010.

(51) Int. Cl.
| | | |
|---|---|---|
| *C23C 16/455* | (2006.01) | |
| *C23C 16/48* | (2006.01) | |
| *C23C 16/56* | (2006.01) | |
| *H01L 21/67* | (2006.01) | |
| *C23C 16/44* | (2006.01) | |
| *H01L 21/677* | (2006.01) | |

(52) U.S. Cl.
CPC ........... *C23C 16/56* (2013.01); *C23C 16/45565* (2013.01); *C23C 16/482* (2013.01); *C23C 16/4405* (2013.01); *H01L 21/6719* (2013.01); *H01L 21/67742* (2013.01)
USPC ..................... 118/715; 156/345.34; 156/345.5

(58) Field of Classification Search
CPC ................ C23C 16/56; C23C 16/4405; C23C 16/45565; C23C 16/482; C23C 16/483; H01L 21/67742; H01L 21/6719

USPC .............. 118/715; 156/345.33, 345.34, 345.5
See application file for complete search history.

(56) References Cited

U.S. PATENT DOCUMENTS

| | | | |
|---|---|---|---|
| 5,781,693 A | 7/1998 | Ballance et al. | |
| 6,090,210 A | 7/2000 | Ballance et al. | |
| 7,037,560 B1 * | 5/2006 | Shinriki et al. | ............... 427/553 |
| 8,455,849 B2 * | 6/2013 | Baluja et al. | ............... 250/504 R |
| 8,657,961 B2 * | 2/2014 | Xie et al. | ......................... 134/1.1 |

(Continued)

OTHER PUBLICATIONS

PCT international search report and written opinion of PCT/US2011/054014 dated May 2, 2012.

*Primary Examiner* — Jeffrie R Lund
(74) *Attorney, Agent, or Firm* — Patterson & Sheridan, LLP

(57) ABSTRACT

Embodiments of the invention generally provide apparatuses and methods for controlling the gas flow profile within a processing chamber. In one embodiment, a processing tool includes an ultraviolet processing chamber defining a processing region, a substrate support, a window disposed between a UV radiation source and the substrate support, and a transparent showerhead disposed within the processing region between the window and the substrate support and having one or more transparent showerhead passages between upper and lower processing regions. The processing tool also includes a gas distribution ring having one or more gas distribution ring passages between a gas distribution ring inner channel and the upper processing region and a gas outlet ring positioned below the gas distribution ring, the gas outlet ring having one or more gas outlet passages between a gas outlet ring inner channel within the gas outlet ring and the lower processing region.

9 Claims, 7 Drawing Sheets

(56) References Cited

U.S. PATENT DOCUMENTS

| | | | |
|---|---|---|---|
| 8,753,449 B2* | 6/2014 | Chhabra et al. | 134/1.1 |
| 2001/0012604 A1* | 8/2001 | Okase et al. | 432/86 |
| 2001/0054385 A1* | 12/2001 | Horiguchi | 118/723 R |
| 2002/0129769 A1 | 9/2002 | Kim et al. | |
| 2005/0109280 A1* | 5/2005 | Chen et al. | 118/724 |
| 2005/0230350 A1* | 10/2005 | Kao et al. | 216/67 |
| 2006/0249175 A1 | 11/2006 | Nowak et al. | |
| 2007/0228289 A1 | 10/2007 | Kaszuba et al. | |
| 2007/0256635 A1* | 11/2007 | Bour et al. | 118/715 |
| 2008/0066778 A1 | 3/2008 | Matsushita et al. | |
| 2008/0127895 A1* | 6/2008 | Shao et al. | 118/725 |
| 2008/0268645 A1* | 10/2008 | Kao et al. | 438/694 |
| 2009/0095621 A1* | 4/2009 | Kao et al. | 204/298.32 |
| 2012/0090691 A1* | 4/2012 | Baluja et al. | 137/13 |
| 2012/0132618 A1* | 5/2012 | Baluja et al. | 216/66 |
| 2012/0244704 A1* | 9/2012 | Kao et al. | 438/683 |
| 2012/0258259 A1* | 10/2012 | Bansal et al. | 427/558 |
| 2013/0177706 A1* | 7/2013 | Baluja et al. | 427/226 |
| 2013/0284204 A1* | 10/2013 | Xie et al. | 134/1.1 |
| 2013/0344704 A1* | 12/2013 | Chhabra et al. | 438/778 |
| 2014/0004717 A1* | 1/2014 | Chan et al. | 438/798 |
| 2014/0017895 A1* | 1/2014 | Chan et al. | 438/694 |
| 2014/0053866 A1* | 2/2014 | Baluja et al. | 134/1.1 |

* cited by examiner

QUARTZ SHOWERHEAD FOR NANOCURE UV CHAMBER

CROSS-REFERENCE TO RELATED APPLICATIONS

This application claims benefit of U.S. Provisional Patent Application Ser. No. 61/394,711, filed Oct. 19, 2010, which is herein incorporated by reference.

BACKGROUND OF THE INVENTION

1. Field of the Invention

Embodiments of the invention relate to processing tools for forming and processing films on substrates, such as with UV light. In particular, embodiments of the invention relate to controlling the gas flow profile within a processing chamber.

2. Description of the Related Art

Materials with low dielectric constants (low-k), such as silicon oxides ($SiO_x$), silicon carbide ($SiC_x$), and carbon doped silicon oxides ($SiOC_x$), find extremely widespread use in the fabrication of semiconductor devices. Using low-k materials as the inter-metal and/or inter-layer dielectric between conductive interconnects reduces the delay in signal propagation due to capacitive effects. The lower the dielectric constant of the dielectric layer, the lower the capacitance of the dielectric and the lower the RC delay of the integrated circuit (IC).

Low k dielectric materials are conventionally defined as those materials that have a dielectric constant k lower than that of silicon dioxide—that is k<4. Typical methods of obtaining low-k materials include doping silicon dioxide with various functional groups containing carbon or fluorine. While fluorinated silicate glass (FSG) generally has k of 3.5-3.9, carbon-doping methods can further lower the k value to approximately 2.5. Current efforts are focused on developing low-k dielectric materials, often referred to as ultra low-k (ULK) dielectrics, with k values less than 2.5 for the most advanced technology needs.

One approach for forming silicon containing films on a semiconductor substrate is through the process of chemical vapor deposition (CVD) within a chamber. Organosilicon supplying materials are often utilized during CVD of the silicon containing films. As a result of the carbon present in such a silicon supplying material, carbon containing films can be formed on the chamber walls as well as on the substrate.

Additionally, ultra low-k (ULK) dielectric materials may be obtained by incorporating air voids within a low-k dielectric matrix, creating a porous dielectric material. Methods of fabricating porous dielectrics typically involve forming a "precursor film" containing two components: a porogen (typically an organic material such as a hydrocarbon) and a structure former or dielectric material (e.g., a silicon containing material). Once the precursor film is formed on the substrate, the porogen component can be removed, leaving a structurally intact porous dielectric matrix or oxide network.

Techniques for removing porogens from the precursor film include, for example, a thermal process in which the substrate is heated to a temperature sufficient for the breakdown and vaporization of the organic porogen. One known thermal process for removing porogens from the precursor film includes a UV curing process to aid in the post treatment of CVD silicon oxide films. For example, U.S. Pat. Nos. 6,566,278 and 6,614,181, both assigned to Applied Materials, Inc., describe use of UV light for post treatment of CVD carbon-doped silicon oxide films.

UV chambers and processes may have non-uniform gas flows through the chamber during the UV curing process to remove porogen. The non-uniform gas flow may result in uneven heating of the substrate during the curing process, resulting in a temperature gradient across the substrate and uneven processing. Additionally, the UV processing chamber can become coated with intact porogen, fragmented species of porogen, and other porogen residues, including coating of the windows that permit UV light to reach the substrate. Because of non-uniform flow, the window may also be preferentially coated towards one edge of the substrate versus the other edge. Additionally, the non-uniform build-up of porogen residue on the window may result in unevenly cured film across the substrate.

With time, the porogen residue can reduce the effectiveness of the subsequent UV porogen removal processes by reducing the effective UV intensity available to the substrate and building up at the colder components of the chamber. Furthermore, the build-up of excessive residues in the chamber can be a source of particulate defects on the substrate which is unsuitable for semiconductor processing. Accordingly, thermally unstable organic fragments of sacrificial materials (resulting from porogens used during CVD to increase porosity) need to be removed from the processing chamber. Increased cleaning times and corresponding reduced throughput is thus necessary to remove porogen residue.

Therefore, a need exists to increase efficiency, throughput, and improve cleaning processes of processing chambers in a production environment, such as a UV processing chamber for a UV porogen removal process. Therefore, there exists a need in the art for a UV chamber that can increase throughput, consume a minimum of energy, and be adapted for in situ cleaning processes of surfaces within the chamber itself.

SUMMARY OF THE INVENTION

Embodiments of the invention generally provide apparatuses and methods for controlling the gas flow profile within a processing chamber. In one embodiment, a processing tool comprises an ultraviolet processing chamber defining a processing region, a substrate support for supporting a substrate within the processing region; an ultraviolet (UV) radiation source spaced apart from the substrate support and configured to generate and transmit ultraviolet radiation to a substrate positioned on the substrate support, a window disposed between the UV radiation source and the substrate support, a transparent showerhead disposed within the processing region between the window and the substrate support and defining an upper processing region and a lower processing region. The upper processing region is located between the window and the transparent showerhead and the lower processing region located between the transparent showerhead and the substrate support. The transparent showerhead has one or more transparent showerhead passages between the upper and lower processing regions. The processing tool further comprises a gas distribution ring having one or more gas distribution ring passages between a gas distribution ring inner channel within the gas distribution ring and the upper processing region, and a gas outlet ring positioned below the gas distribution ring, the gas outlet ring having one or more gas outlet passages between a gas outlet ring inner channel within the gas outlet ring and the lower processing region.

In another embodiment, a method of controlling the flow distribution profile in a processing chamber comprises injecting gaseous species into an upper processing region of the processing chamber, the upper processing region located between a window and a transparent showerhead positioned within the processing chamber, flowing the gaseous species through one or more passages formed in the transparent showerhead and into a lower processing region, the lower processing region located between the showerhead and a substrate support located within the processing chamber, and ejecting the gaseous species from the lower processing region and through an exhaust port.

In another embodiment, a method for cleaning a processing chamber, comprises injecting a cleaning gas into an upper processing region of the processing chamber, the upper processing region located between a window and a transparent showerhead positioned within the processing chamber, reacting the cleaning gas with at least one of UV light and heat to form a reactive species, flowing the reactive species through one or more passages formed in the transparent showerhead and into a lower processing region, the lower processing region located between the showerhead and a substrate support located within the processing chamber, removing residue deposited on surfaces of the window and the transparent showerhead, and ejecting the reactive species and residue from the lower processing region and through an exhaust port.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
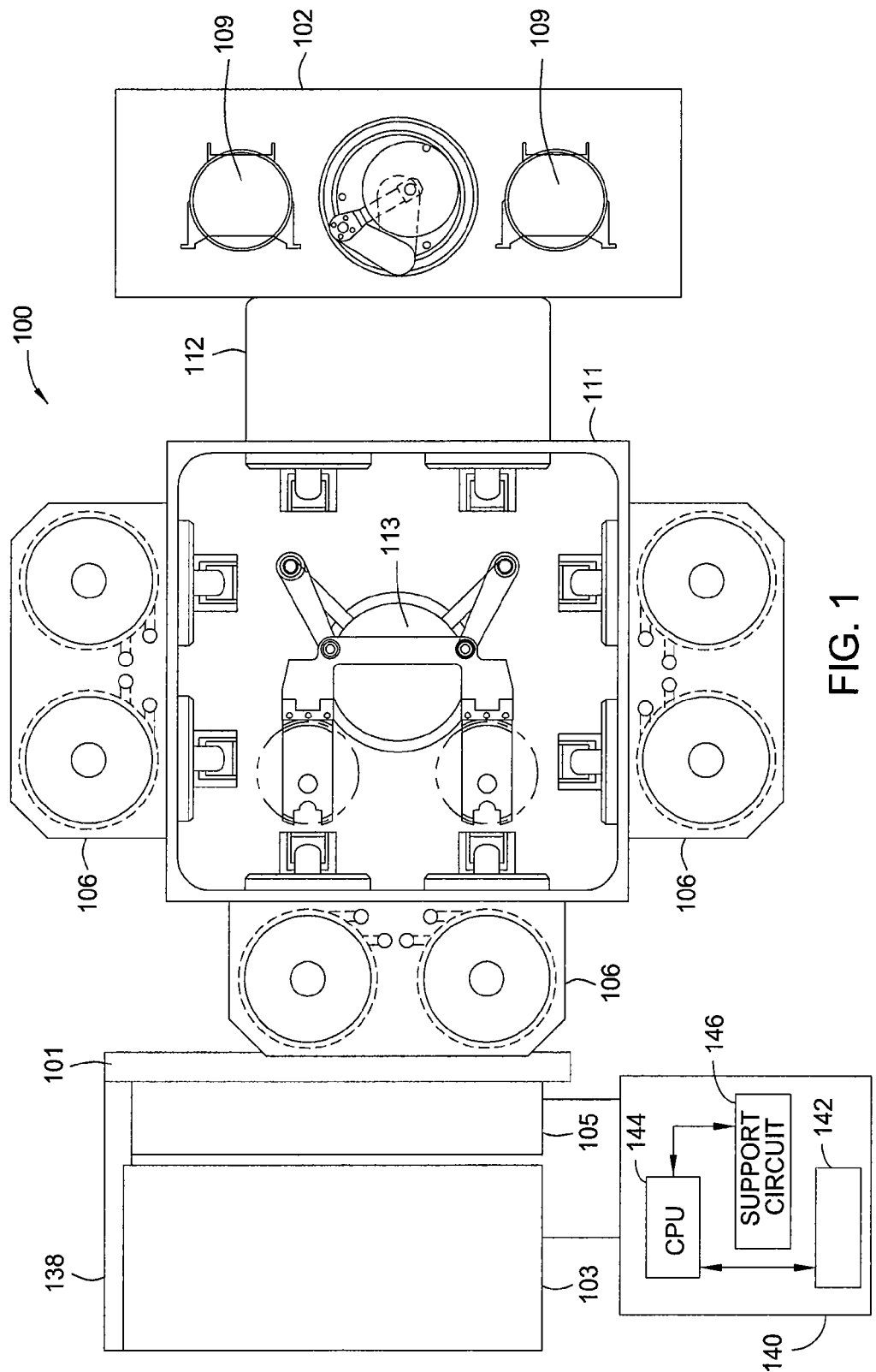
FIG. 1 is a plan view of a semiconductor processing system in which embodiments of the invention may be incorporated.

Embodiments of the invention generally provide a processing tool having an ultraviolet (UV) processing chamber and hardware within the processing chamber for controlling the flow profile within the processing region. Embodiments of the invention enable the processing tool to control the delivery, flow path, distribution, and removal of gases within an ultraviolet processing chamber to better control various processes. Embodiments of the invention also provide methods of controlling the flow profile within a processing tool and a method of cleaning the processing tool.

The design of the hardware enables a specific flow profile distribution across a substrate being processed within a UV chamber, a lamp heated chamber, or other chambers where energy in the form of light is used to process a film or catalyze a reaction, either directly on or above the substrate. Additionally, the process chamber walls, UV windows, and substrate support may be efficiently cleaned by removing any residue build up. Moreover, embodiments of the invention decrease initial residue build up by controlling the flow profile of the substrate outgassing during substrate processing. Although any processing chamber or process may use embodiments of the invention, UV curing of porogen-containing films will be used to describe the invention.

In one embodiment of a processing chamber used for UV curing, a tandem processing chamber provides two separate and adjacent processing regions in a chamber body and a lid having one or more bulb isolating windows aligned respectively above each processing region. The bulb isolating windows may be implemented with one window per side of the tandem processing chamber to isolate one or more bulbs from the substrate in one large common volume, or with each bulb of an array of bulbs enclosed in a UV transparent envelope which is in direct contact with a processing region. One or more UV bulbs per processing region may be covered by housings coupled to the lid and emit UV light that is directed through the windows onto each substrate located within each processing region.

The UV bulbs can be an array of light emitting diodes or bulbs utilizing any of the state of the art UV illumination sources including, but not limited to, microwave arcs, radio frequency filament (capacitively coupled plasma) and inductively coupled plasma (ICP) lamps. Additionally, the UV light can be pulsed during a cure process. Various concepts for enhancing uniformity of substrate illumination include use of lamp arrays which can also be used to vary wavelength distribution of incident light, relative motion of the substrate and lamp head including rotation and periodic translation (sweeping), and real-time modification of lamp reflector shape and/or position. The UV bulbs are a source of ultraviolet radiation, and may transmit a broad spectral range of wavelengths of UV and infrared (IR) radiation.

Residues formed during the curing process may comprise carbon, e.g. both carbon and silicon, and are removed using an ozone based clean. Production of the necessary ozone may be done remotely with the ozone transported to the curing chamber, generated in-situ, or accomplished by running these two schemes simultaneously. Methods of generating the ozone remotely can be accomplished using any existing ozone generation technology including, but not limited to, dielectric barrier/corona discharge (e.g., Applied Materials' Ozonator) or UV-activated reactors. The UV bulbs used for curing the dielectric material and/or additional UV bulb(s) that can be remotely located may be used to generate the ozone.

FIG. 1 shows a plan view of a semiconductor processing system 100 which may use embodiments of the invention. The system 100 illustrates one embodiment of a Producer™ processing system, commercially available from Applied Materials, Inc., of Santa Clara, Calif. The processing system 100 is a self-contained system having the necessary processing utilities supported on a mainframe structure 101. The processing system 100 generally includes a front end staging area 102 where substrate cassettes 109 are supported and substrates are loaded into and unloaded from a loadlock chamber 112, a transfer chamber 111 housing a substrate handler 113, a series of tandem processing chambers 106 mounted on the transfer chamber 111 and a back end 138 which houses the support utilities needed for operation of the system 100, such as a gas panel 103, and a power distribution panel 105.

Figure 3:
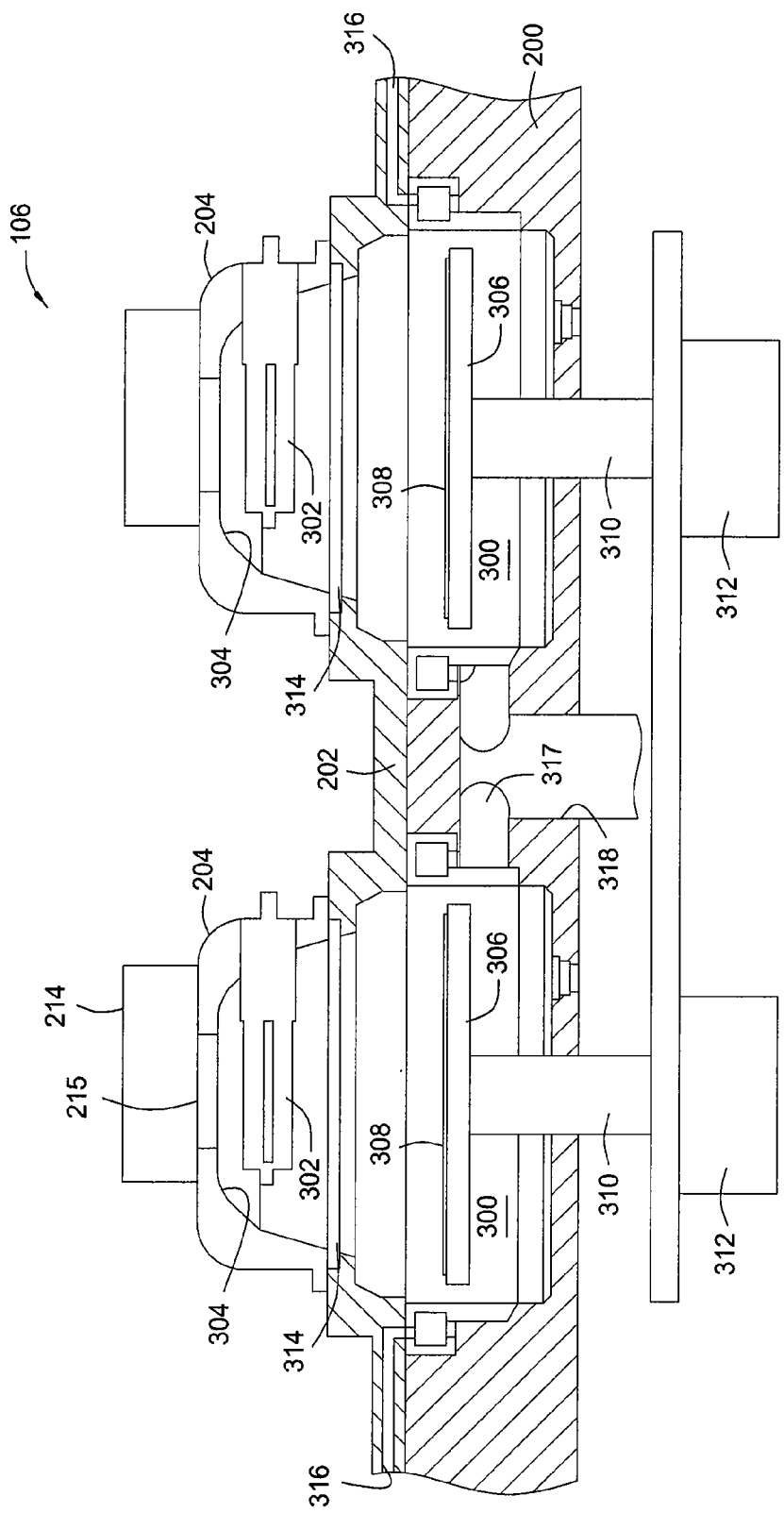
FIG. 3 is a partial section view of the tandem processing chamber that has a lid assembly with two UV bulbs disposed respectively above two processing regions.

Each of the tandem processing chambers 106 includes two processing regions for processing the substrates (see, FIG. 3). The two processing regions share a common supply of gases, common pressure control, and common process gas exhaust/pumping system. Modular design of the system enables rapid conversion from any one configuration to any other. The arrangement and combination of chambers may be altered for purposes of performing specific process steps. Any of the tandem processing chambers 106 can include a lid according to aspects of the invention as described below that includes one or more ultraviolet (UV) lamps for use in a cure process of a low K material on the substrate and/or in a chamber clean process. In one embodiment, all three of the tandem processing chambers 106 have UV lamps and are configured as UV curing chambers to run in parallel for maximum throughput.

In an alternative embodiment where not all of the tandem processing chambers 106 are configured as UV curing chambers, the system 100 can be adapted with one or more of the tandem processing chambers having supporting chamber hardware known to accommodate various other known processes such as chemical vapor deposition (CVD), physical vapor deposition (PVD), etch, and the like. For example, the system 100 can be configured with one of the tandem processing chambers 106 as a CVD chamber for depositing materials, such as a low dielectric constant (K) film, on the substrates. Such a configuration can maximize research and development fabrication utilization and, if desired, eliminate exposure of as-deposited films to atmosphere.

A controller 140, including a central processing unit (CPU) 144, a memory 142, and support circuits 146, is coupled to the various components of the semiconductor processing system 100 to facilitate control of the processes of the present invention. The memory 142 can be any computer-readable medium, such as random access memory (RAM), read only memory (ROM), floppy disk, hard disk, or any other form of digital storage, local or remote to the semiconductor processing system 100 or CPU 144. The support circuits 146 are coupled to the CPU 144 for supporting the CPU in a conventional manner. These circuits include cache, power supplies, clock circuits, input/output circuitry and subsystems, and the like. A software routine or a series of program instructions stored in the memory 142, when executed by the CPU 144, causes the UV curing tandem processing chambers 106 to perform processes of the present invention.

Figure 2:
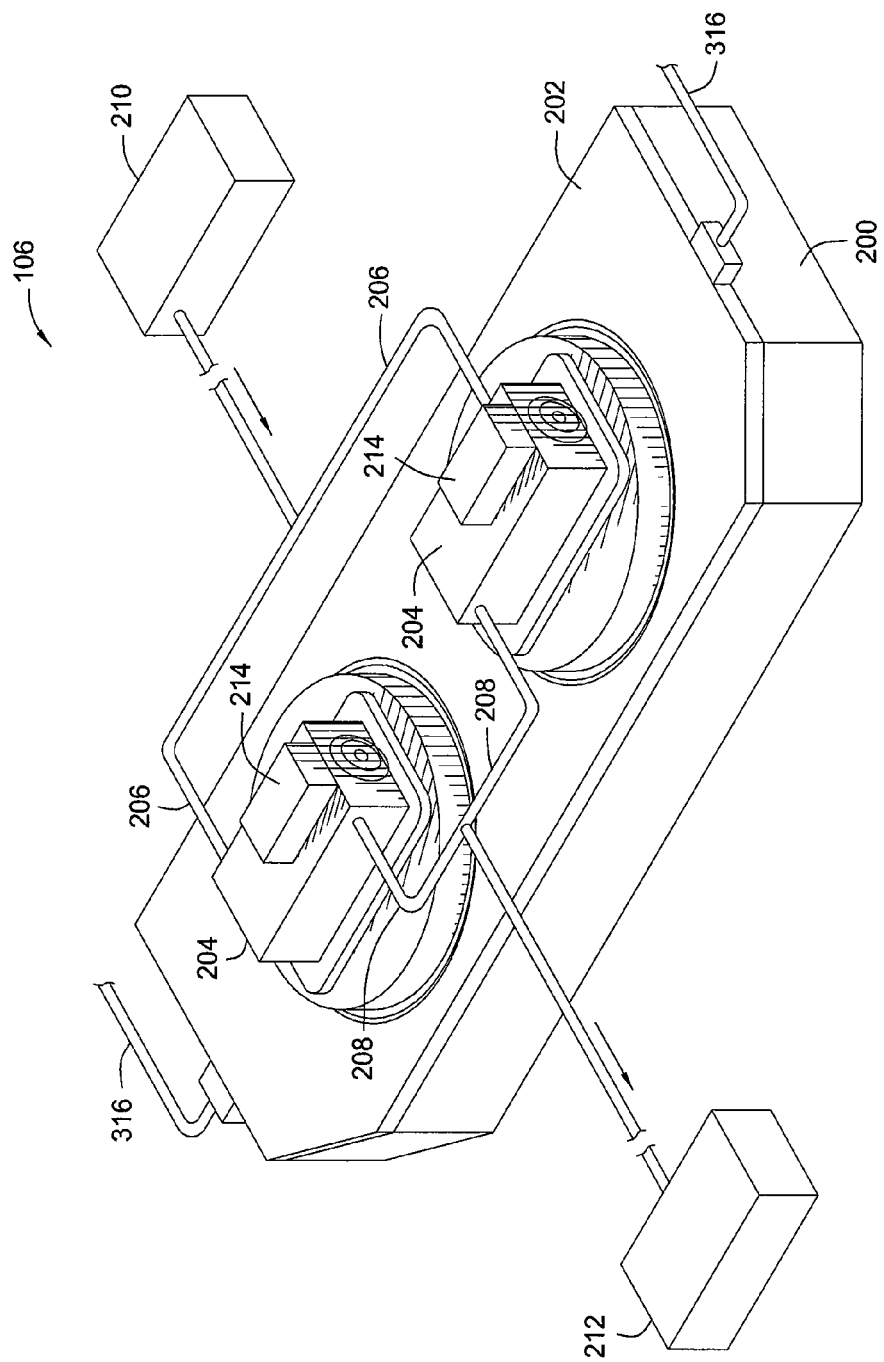
FIG. 2 is a view of a tandem processing chamber of the semiconductor processing system that is configured for UV curing.

FIG. 2 illustrates one of the tandem processing chambers 106 of the semiconductor processing system 100 that is configured for UV curing. The tandem processing chamber 106 includes a body 200 and a lid 202 that can be hinged to the body 200. The chamber body 200 may be made from aluminum. Coupled to the lid 202 are two housings 204 that are each coupled to inlets 206 along with outlets 208 for passing cooling air through an interior of the housings 204. The cooling air can be at room temperature or approximately twenty-two degrees Celsius. A central pressurized air source 210 provides a sufficient flow rate of air to the inlets 206 to insure proper operation of any UV lamp bulbs and/or power sources 214 for the bulbs associated with the tandem processing chamber 106. The outlets 208 receive exhaust air from the housings 204, which is collected by a common exhaust system 212 that can include a scrubber to remove ozone potentially generated by the UV bulbs, depending on bulb selection. Ozone management issues can be avoided by cooling the lamps with oxygen-free cooling gas (e.g., nitrogen, argon or helium).

FIG. 3 shows a partial section view of the tandem processing chamber 106 with the lid 202, the housings 204 and the power sources 214. Each of the housings 204 cover a respective one of two UV lamp bulbs 302 disposed respectively above two processing regions 300 defined within the body 200. Each of the processing regions 300 includes a heating substrate support, such as substrate support 306, for supporting a substrate 308 within the processing regions 300. The substrate supports 306 can be made from ceramic or metal such as aluminum. Preferably, the substrate supports 306 couple to stems 310 that extend through a bottom of the body 200 and are operated by drive systems 312 to move the substrate supports 306 in the processing regions 300 toward and away from the UV lamp bulbs 302. The drive systems 312 can also rotate and/or translate the substrate supports 306 during curing to further enhance uniformity of substrate illumination. Adjustable positioning of the substrate supports 306 enables control of volatile cure by-product and purge and clean gas flow patterns and residence times in addition to potential fine tuning of incident UV irradiance levels on the substrate 308 depending on the nature of the light delivery system design considerations such as focal length.

In general, any UV source such as mercury microwave arc lamps, pulsed xenon flash lamps or high-efficiency UV light emitting diode arrays may be used. The UV lamp bulbs 302 are sealed plasma bulbs filled with one or more gases such as xenon (Xe) or mercury (Hg) for excitation by the power sources 214. Preferably, the power sources 214 are microwave generators that can include one or more magnetrons (not shown) and one or more transformers (not shown) to energize filaments of the magnetrons. In one embodiment having kilowatt microwave (MW) power sources, each of the housings 204 includes an aperture 215 adjacent the power sources 214 to receive up to about 6000 W of microwave power from the power sources 214 to subsequently generate up to about 100 W of UV light from each of the bulbs 302. In another embodiment, the UV lamp bulbs 302 can include an electrode or filament therein such that the power sources 214 represent circuitry and/or current supplies, such as direct current (DC) or pulsed DC, to the electrode.

For some embodiments, the power sources 214 can include radio frequency (RF) energy sources that are capable of excitation of the gases within the UV lamp bulbs 302. The configuration of the RF excitation in the bulb can be capacitive or inductive. An inductively coupled plasma (ICP) bulb can be used to efficiently increase bulb brilliancy by generation of denser plasma than with the capacitively coupled discharge. In addition, the ICP lamp eliminates degradation in UV output due to electrode degradation resulting in a longer-life bulb for enhanced system productivity. Benefits of the power sources 214 being RF energy sources include an increase in efficiency.

Preferably, the bulbs 302 emit light across a broad band of wavelengths from 170 nm to 400 nm. In one embodiment of the invention, the bulbs 302 emit light at wavelengths from 185 nm to 255 nm. The gases selected for use within the bulbs 302 can determine the wavelengths emitted. UV light emitted from the UV lamp bulbs 302 enters the processing regions 300 by passing through windows 314 disposed in apertures in the lid 202. The windows 314 preferably are made of an OH free synthetic quartz glass and have sufficient thickness to maintain vacuum without cracking. Further, the windows 314 are preferably fused silica that transmits UV light down to approximately 150 nm. Since the lid 202 seals to the body 200 and the windows 314 are sealed to the lid 202, the processing regions 300 provide volumes capable of maintaining pressures from approximately 1 Torr to approximately 650 Torr. Processing or cleaning gases enter the processing regions 300 via a respective one of two inlet passages 316. The processing or cleaning gases then exit the processing regions 300 via a common outlet port 318. Additionally, the cooling air supplied to the interior of the housings 204 circulates past the bulbs 302, but is isolated from the processing regions 300 by the windows 314.

The housings 204 may include an interior parabolic surface defined by a cast quartz lining 304 coated with a dichroic film. The quartz linings 304 reflect UV light emitted from the UV lamp bulbs 302 and are shaped to suit the cure processes as well as the chamber clean processes based on the pattern of UV light directed by the quartz linings 304 into the processing regions 300. The quartz linings 304 may adjust to better suit each process or task by moving and changing the shape of the interior parabolic surface. Additionally, the quartz linings 304 may transmit infrared light and reflect ultraviolet light emitted by the bulbs 302 due to the dichroic film. The dichroic film usually constitutes a periodic multilayer film composed of diverse dielectric materials having alternating high and low refractive index. Since the coating is non-metallic, microwave radiation from the power sources 214 that is downwardly incident on the backside of the cast quartz linings 304 does not significantly interact with, or get absorbed by, the modulated layers and is readily transmitted for ionizing the gas in the bulbs 302.

Substrates are brought into the processing region 300, to perform a post-treatment cure of dielectric films deposited on the substrate 308. The films may be low-k dielectric films having porogen including, for example, a silicon backbone structure and carbon within the film. The silicon backbone structure and carbon within the film is sometimes referred to as porogen. After UV exposure, the carbon bonds break and the carbon outgases from the film, leaving a silicon backbone, and increasing porosity which decreases the k value and reduces the current carrying capacity of the film.

In conventional systems, a cross-flow non-uniform gas flow profile purges the chamber during curing and outgassing of the substrate. A purge gas flows from one side of the chamber to the opposite side, in-between the substrate and the window, so that any residue escaping the film is carried away before it can condense on the window or anywhere else in the chamber. Due to the uncontrolled non-uniformity of the flow profile, the substrate processing would also be non-uniform and result in a temperature gradient across the substrate. However, the resultant non-uniformity of the films in the 45 nm range may be acceptable, but will not be in the next generation of 20-28 nm films.

Figure 4:
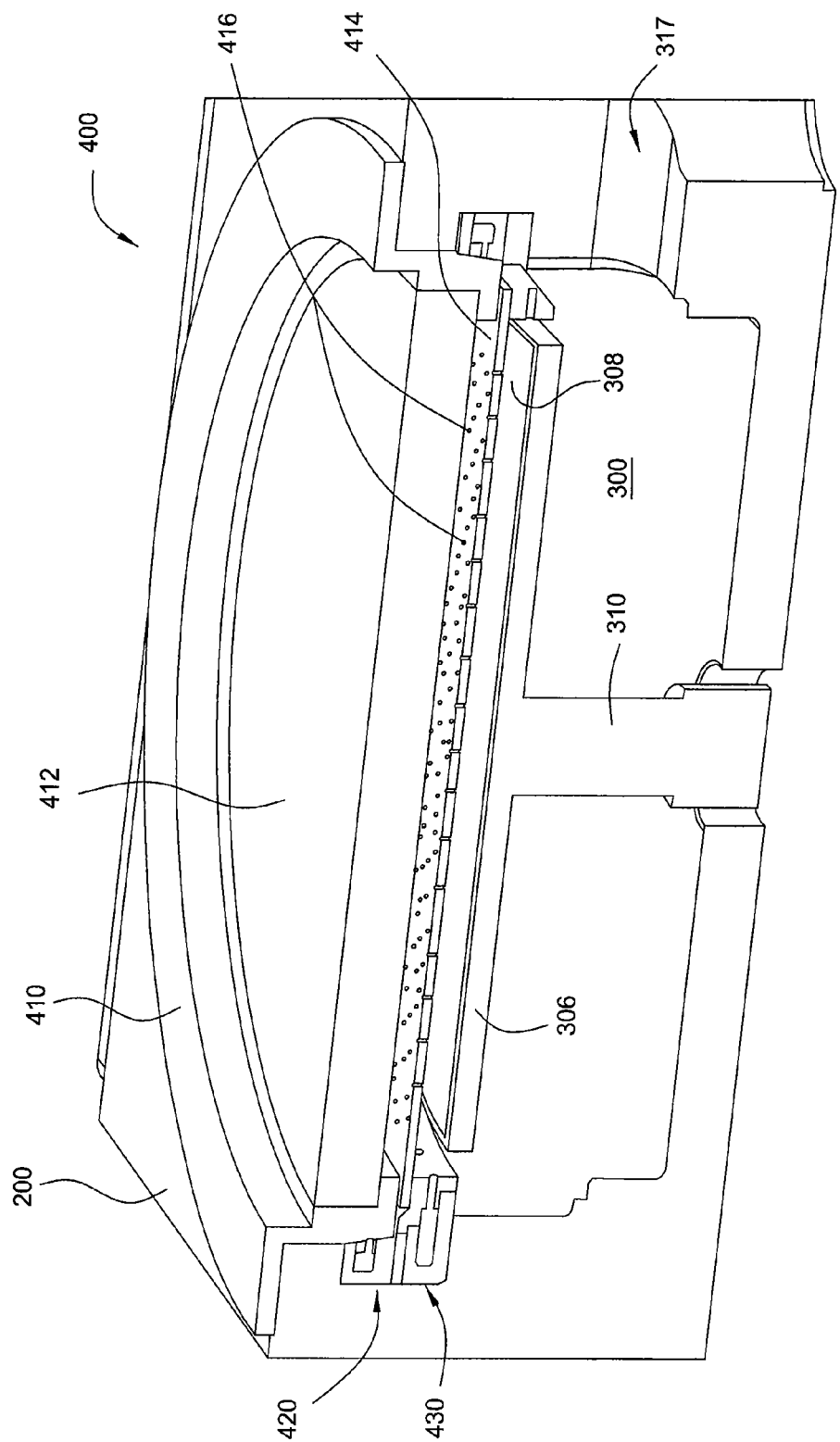
FIG. 4 is a schematic isometric cross-sectional view of a portion of one of the processing chambers without the lid assembly.
Figures 5A, 5B:
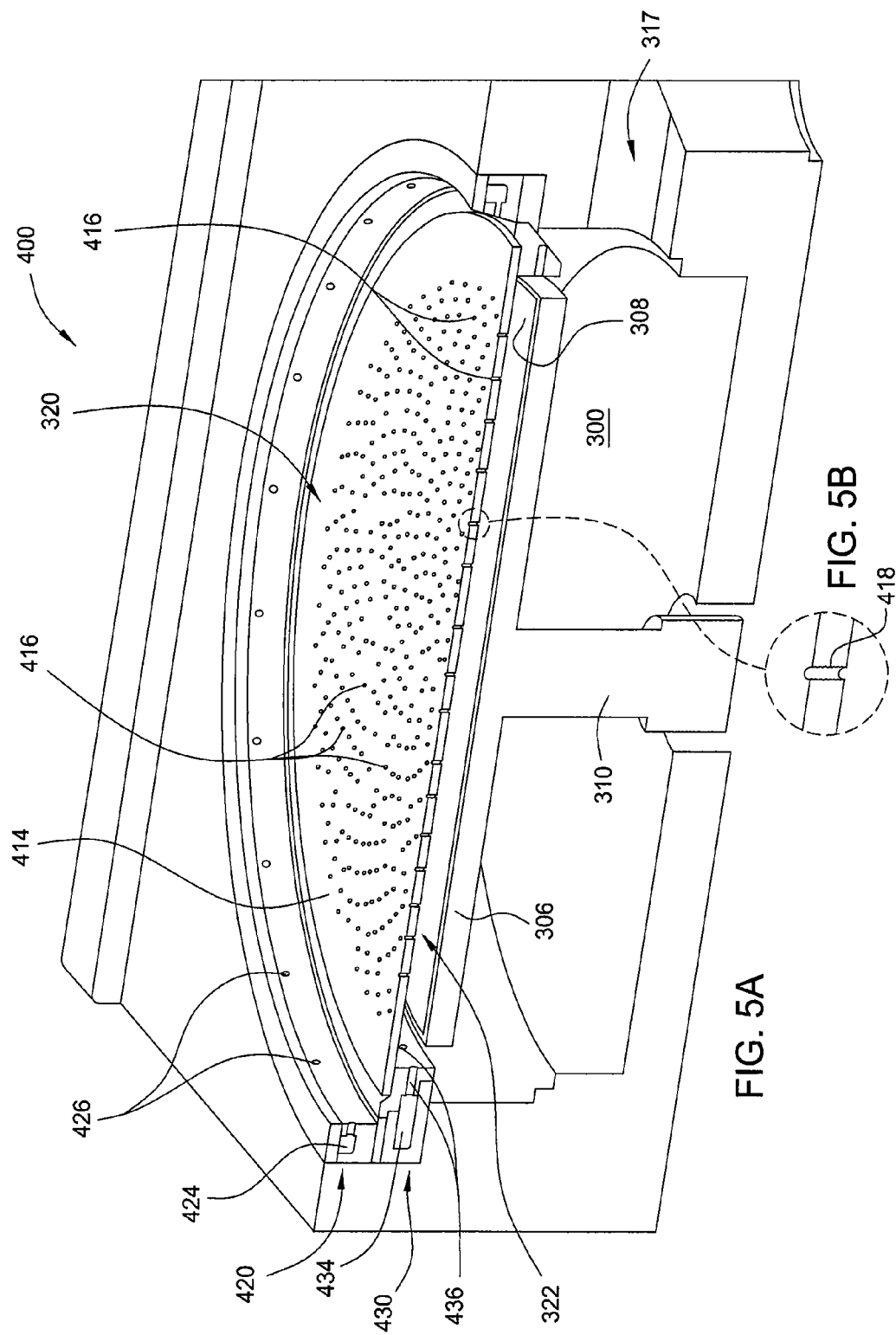
FIG. 5A is a schematic isometric cross-sectional view of the processing chamber in FIG. 4 without the window assembly.
FIG. 5B is a close up of the cross-section of the showerhead shown in FIG. 5A.

Embodiments of the invention involve the design of hardware that enables a specific gas flow profile distribution across the substrate 308 being processed in a UV chamber, lamp heated chamber, or other chamber where "light" energy is used to process a film or catalyze a reaction, either directly on or above the substrate 308. Various embodiments of the invention will be described in relation to FIGS. 4-5B. FIG. 4 shows a schematic isometric cross-sectional view of a portion of one of the processing chambers 400 including embodiments of the invention to improve gas flow profile uniformity and increase substrate throughput during processing. FIG. 5A is a schematic isometric cross-sectional view of the processing chamber 400 in FIG. 4 without the window assembly. FIG. 5B is a close up of the cross-section of the showerhead shown in FIG. 5A.

A portion of processing chamber 400 shows various hardware designs to enable control of the gas flow profile throughout the processing chamber. A window assembly is positioned within the processing chamber 400 to hold a UV vacuum window 412. The window assembly includes a vacuum window clamp 410 that rests on a portion of the body 200 and supports a vacuum window 412 through which UV light may pass from the UV lamps 302, which is part of the lid assembly above the body 200. The vacuum window 412 is positioned between the UV radiation source, such as UV lamps 302, and the substrate support 306. The UV radiation source 302 is spaced apart from the substrate support 306 and configured to generate and transmit ultraviolet radiation to a substrate 308 positioned on the substrate support 306.

A transparent showerhead 414 is positioned within the processing region 300 and between the vacuum window 412 and the substrate support, such as substrate support 306. The transparent showerhead defines an upper processing region 320 between the vacuum window 412 and transparent showerhead 414 and further defines a lower processing region 322 between the transparent showerhead 414 and the substrate support, such as substrate support 306 (FIG. 5A). The transparent showerhead 414 also has one or more passages 416 between the upper and lower processing regions 320, 322. The passages 416 may have a roughened surface 418, sometimes referred to as "frosted", so that the passages 416 are not perfectly transparent, which otherwise could potentially cause shadows on the substrate 308 and impair proper curing of the film. The passages 416, which may be frosted, diffuse the UV light so there is no light pattern on the substrate 308 during processing.

The transparent showerhead 414 forms a second window through which UV light may pass to reach the substrate 308. As a second window, the showerhead 414 needs to be transparent to the wavelengths of light desired for curing the film on the substrate 308. The transparent showerhead may be formed of various transparent materials such as quartz or sapphire. The passages 416 may be formed by drilling holes through a quartz piece to form and shape the transparent showerhead 414 to fit within the processing region 300. The surface of the quartz piece may be flame polished whereas the drilled holes may be etched to form the roughened surface 418. The size and density of the passages 416 may be uniform or non-uniform to effectuate the desired flow characteristics across the substrate surface. The passages 416 may have either a uniform flow profile where the flow per radial area across the substrate 308 is uniform or the gas flow can be preferential to the center or edge of the substrate 308, i.e. the gas flow may have a preferential flow profile.

The transparent showerhead 414 and vacuum window 412 may be coated to have a band pass filter and to improve transmission of the desired wavelengths. For example, an anti-reflective coating (ARC) may be deposited on the transparent showerhead 414 and vacuum window 412 to improve the transmission efficiency of desired wavelengths. A reflective coating to reflect IR and allow UV to pass or a dichroic coating to reflect UV and allow IR to pass may also be applied to the transparent showerhead 414 and vacuum window 412 surfaces. The coatings may be formed by PVD, CVD, or other suitable deposition techniques. The coatings may comprise an inorganic film layer having a desired film transmittance and refractive index that can assist in the transmission of light through the transparent showerhead 414 and vacuum window 412 to the substrate 308. In one embodiment, the coatings may contain a titanium oxide ($TiO_2$) layer, a tin oxide layer ($SnO_2$), silicon oxide ($SiO_2$) or combinations thereof, which are formed on the surfaces of the vacuum window 412 and transparent showerhead 414.

In another embodiment, the ARC coating may be a composite layer having one or more layers formed on the surfaces of the vacuum window 412 and transparent showerhead 414. In one embodiment, the ARC coating may be a film stack including a first layer formed on a second layer, which is formed on the surfaces of the of the vacuum window 412 and transparent showerhead 414. In one embodiment, the first layer may be a silicon oxide layer ($SiO_2$) and the second layer may be a titanium oxide ($TiO_2$) layer or a tin oxide layer ($SnO_2$) or vise versa. In another embodiment, the ARC layer may include a film stack containing repeated silicon oxide ($SiO_2$) and titanium oxide ($TiO_2$) layers.

A gas distribution ring 420 having one or more gas distribution ring passages 426 is disposed within the processing region 300. The one or more gas distribution ring passages 426 couple a gas distribution ring inner channel 424 with the upper processing region 320, forming a gas flow path between the inner channel 424 and the upper processing region 320 above the transparent showerhead 414. A gas outlet ring 430 is positioned below the gas distribution ring 420 and may be at least partially below the transparent showerhead 414 within the processing region 300. The gas outlet ring 430 also has one or more gas outlet passages 436 coupling a gas outlet ring inner channel 434 and the lower processing region 322, forming a gas flow path between the lower processing region 322 and the gas outlet inner channel 434. The one or more gas outlet passages 436 of the gas outlet ring 430 are disposed at least partially below the transparent showerhead 414.

Figure 6:
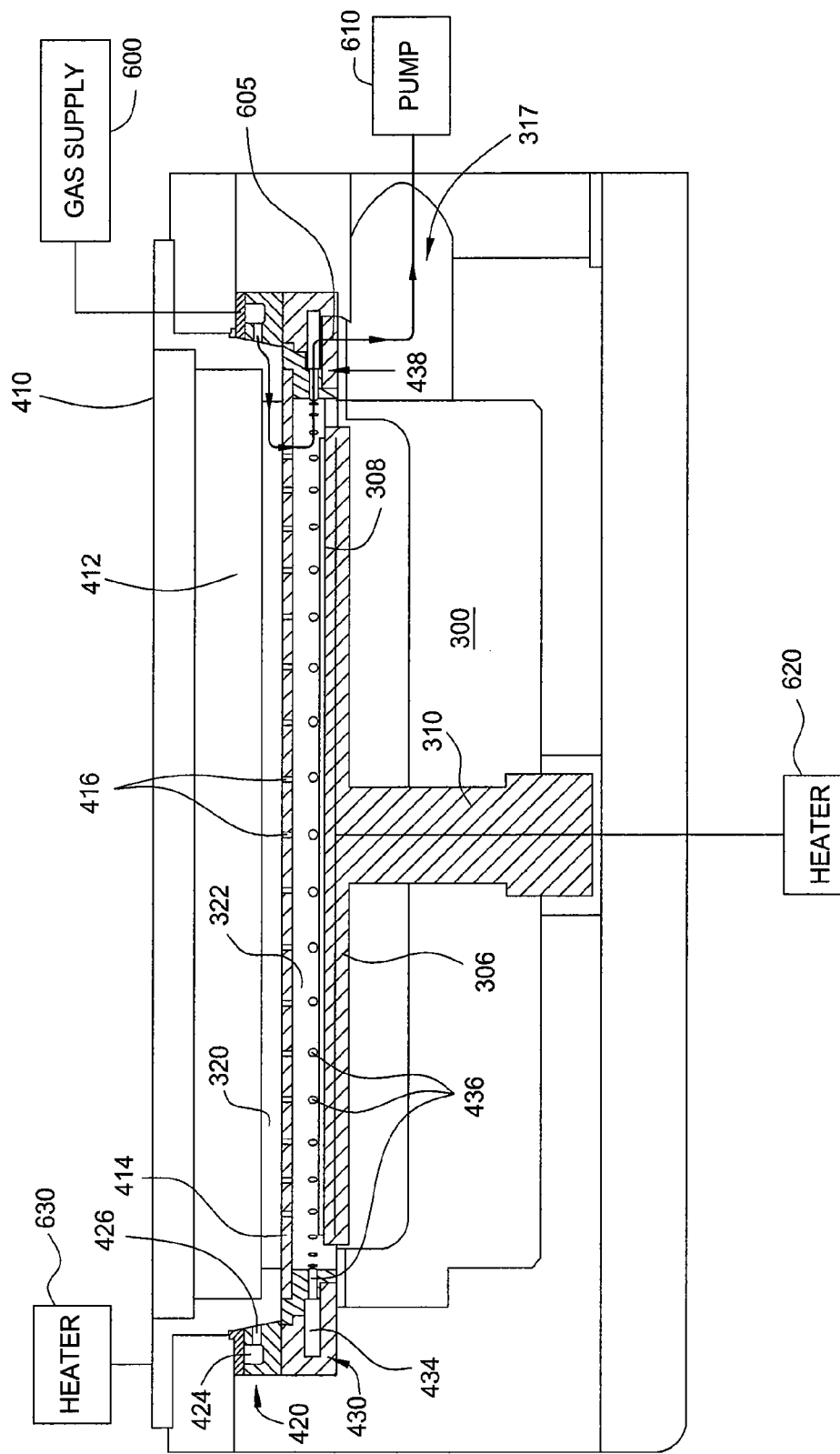
FIG. 6 is a schematic cross-sectional view of the processing chamber in FIG. 5A illustrating a gas flow path.

FIG. 6 depicts a schematic cross-sectional view of the processing chamber in FIG. 5A illustrating a gas flow path. Purge gas or other types of gases may be injected into the upper processing region 320 between the vacuum window 412 and the transparent showerhead 414, through the transparent showerhead 414, and down towards the substrate from the transparent showerhead 414. The size of the passages 416, 426, 436 and gas flow rates may be adjusted so that a back pressure forms to even out the flow down towards the substrate 308. The gas flow washes over the substrate from above, spreads out concentrically, and exits the lower processing region 322 through gas outlet passages 436 and to a pump 610.

Arrows 605 depict the gas flow path from the gas distribution ring 420, through the transparent showerhead 414, over the substrate support 306 which may also have a substrate 308 thereon, through the gas outlet ring 430, and exiting the chamber 400. The density and size of the passages 416, 426, 436 may be adjusted to increase or decrease the gas flow velocity as desired. In one embodiment, the density and size of the passages 416, 426, 436 provide a uniform flow profile across the substrate 308. The hardware, such as the gas distribution ring 420, provides ample pressure drop to evenly distribute the gases prior to entering the upper processing region 320 above the transparent showerhead 414. The gases may then evenly fill the upper processing region 320 above the transparent showerhead 414 due to the high flow resistance through the passages 416 of the showerhead 414. The gas flow proceeds to the substrate and is then pumped out evenly through the gas outlet ring 430 to pump 610.

Depending on the pattern of the passages 416 in the showerhead 414, the flow may be uniform (proportional to the substrate area) or preferential toward the center or edge. Thus, the gas flow profile may be controlled across the substrate 308 to provide a desired uniform or non-uniform distribution.

Additionally, the temperature profile across the substrate 308 may also be controlled to be uniform or non-uniform. Thus, embodiments of the present invention provide the ability to not only to create uniform gas flow and temperature profiles across the substrate, but to create and control a desired non-uniform gas and temperature profile.

In some embodiments of the invention, the gas composition may include purge gases for purging the chamber. Such gases may include inert gaseous species or non-reactive gases such as argon (Ar), helium (He), nitrogen ($N_2$), and the like. In another embodiment, the gas composition may include cleaning gases for cleaning the processing chamber and components within the chamber. The cleaning gases may include ozone, Ar, He, or combinations thereof. Embodiments of the invention are particularly helpful for improving the cleaning process when the cleaning gas is ozone. The ozone may be generated remotely from the processing region or introducing ozone into the chamber may include activating oxygen with ultraviolet light to create ozone. A gas supply 600 may couple the ozone generation source to the processing region 300. The smaller volume of the chamber may improve the cleaning efficiency when using ozone. The UV light and heat supplied to the processing region can break down the ozone into oxygen radicals for reacting with deposited residues to remove them.

When the UV lamp 302 is turned on, both the vacuum window 412 and the transparent showerhead 414 are heated due to the infrared light coming from the lamp. The transparent showerhead 414 may be transparent to UV light but absorbs some of the IR light, thus creating a heated channel between the two windows for the ozone to break down in the upper processing region 320, and then travel down into the lower processing region 322 for cleaning. The IR light absorbed by the transparent showerhead 414 creates a temperature gradient which interacts with ozone injected into the upper processing region 320 from the gas distribution ring 420, causing the ozone to break down. The amount of ozone breaking down may be proportional to the temperature and surface area of the components surrounding the upper processing region 320, such as the showerhead 414 and the gas distribution ring 420. By increasing the surface area of the heated components, less energy may be necessary to break down the ozone into reactive oxygen radicals, and improve cleaning efficiencies. Additionally, ozone may be delivered to the substrate 308 uniformly where the UV light will break the ozone into $O_2$ and radical oxygen, which can be used to etch an organic film or material on the substrate 308.

As shown in FIG. 6, another heater 630 may be used to heat the components in the processing chamber such as the vacuum window clamp 410, the vacuum window 412, and the gas distribution ring 420. Heating these hardware components may improve the efficiency of ozone degeneration and reduces the deposition of porogen on the components. The gas distribution ring 420, gas outlet ring 430, and vacuum window clamp 410 may be made of anodized aluminum to increase the emissivity of those components. The components may then absorb more heat, raising the temperature of the components, and reducing the amount of residue deposition on the components, resulting in reduced clean times, improved throughput, and particle performance. Additionally, heat may be provided to the exhaust port 317 to also reduce or prevent porogen from collecting in the exhaust port 317.

A gas supply 600 is coupled with the gas distribution ring 420 to provide the various gases for deposition, forming, treating, purging, and cleaning processes that may be performed in the chamber 400. In another embodiment, a remote plasma source (RPS) may also be coupled with the gas distribution ring 420 to provide plasma energized species into the processing region if desired. A gas pump 610 is coupled with the gas outlet ring 430 for removing gaseous compounds from the chamber. Additionally, a heater 620 is coupled with the substrate support 306 for heating the substrate and the surrounding areas, including the gases in the lower processing region 322.

Figure 7:
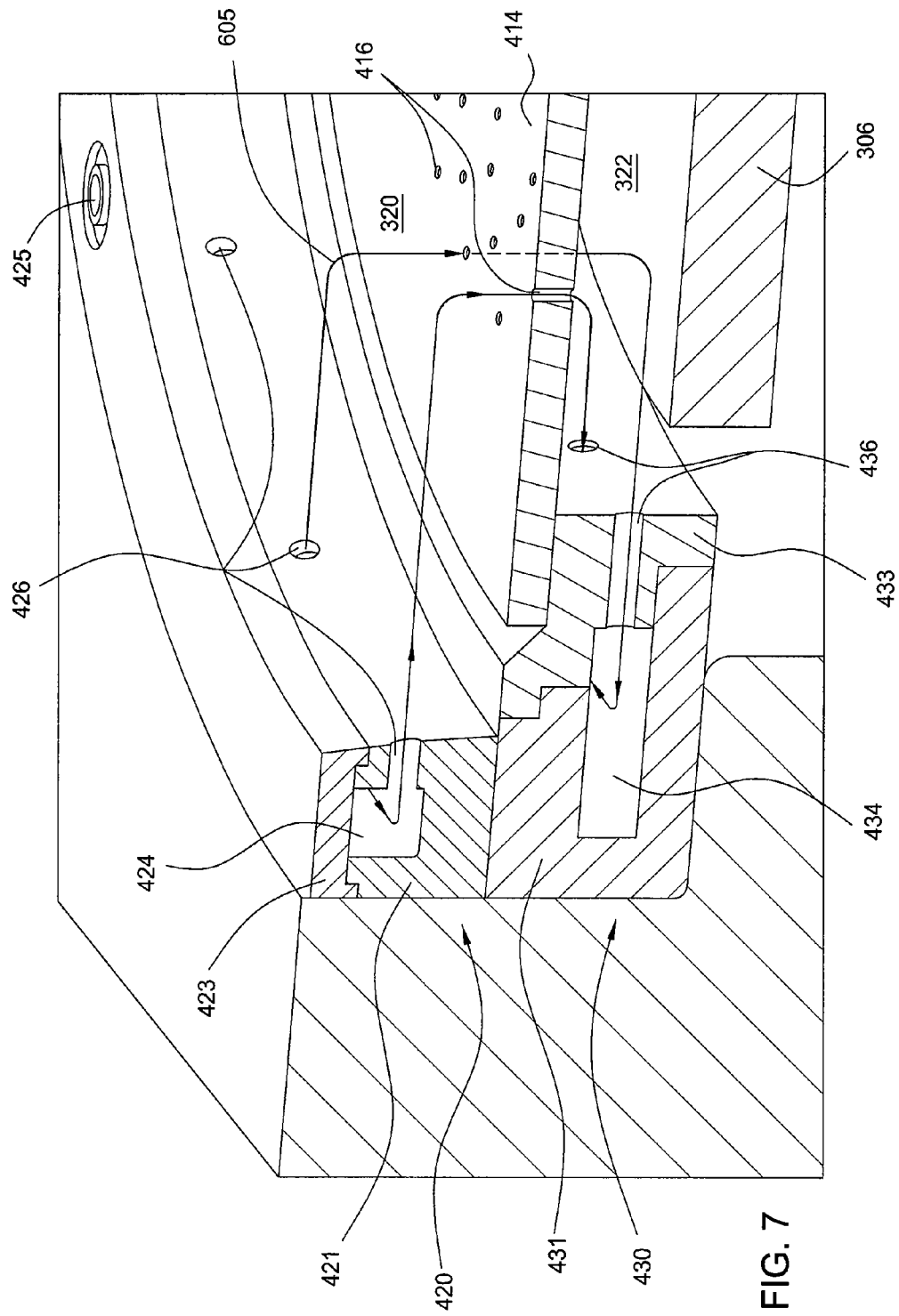
FIG. 7 is a close up isometric cross-sectional view of a portion of the processing chamber and a gas flow path as shown in FIG. 6.

FIG. 7 is a close up isometric cross-sectional view of a portion of the processing chamber and a gas flow path as shown in FIG. 6. The gas distribution ring 420 and gas outlet ring 430 may comprise various components. The gas distribution ring 420 may comprise a base distribution ring 421 and a gas inlet ring 423. The base distribution ring 421 may define the one or more gas distribution ring passages 426. The gas inlet ring 423 may be coupled with the base distribution ring 421 which together may define the gas distribution ring inner channel 424. The gas inlet ring 423 may also have one or more gas inlets 425 through which gas may enter the gas distribution ring inner channel 424. A gas supply source 600 is coupled to the gas inlets 425 for providing gaseous species and mixtures to the gas distribution ring 420.

The gas outlet ring 430 may comprise a base outlet ring 431 and a gas pumping ring 433. The gas pumping ring 433 may define the one or more gas outlet passages 436 and support the transparent showerhead 414. A base outlet ring 431 is coupled with the gas pumping ring 433 to form the gas outlet ring 430. The base outlet ring 431 and the gas pumping ring 433 may together define the gas outlet ring inner channel 434. At least one gas outlet 438 of the gas outlet ring 430 (see FIG. 6) may be aligned with the exhaust port 317 for gas to exit the gas outlet ring 430.

As shown in FIG. 7 and depicted by arrows 605, gas may enter the gas inlet 425 and flow through the gas distribution ring inner channel 424 and out the passages 426 of the gas outlet ring 430. The gas fills the volume above the transparent showerhead 414, e.g. the upper processing region 320, and flows through the showerhead passages 416. The gas then flows concentrically and radially across substrate 308 to the gas outlet passages 436. The gas then is ejected from the lower processing region 322, enters the gas outlet ring inner channel 434, flows through the inner channel 434, and exits the gas outlet 438 into the gas exhaust port 317 and to the pump 610.

The concentric flow profile provided by embodiments of the invention may also permit adjustments in pressures, gas compositions, gas mixtures, etc. to change the temperature profile on the substrate 308, such as if a substrate edge cold or edge hot process would be desired. Conventional designs did not permit adjustability of these variables to create and control temperature profiles across the substrate surface. For example, in some embodiments of the invention, changes in pressure and more argon or more helium may be used to adjust the temperature profile. Helium is more efficient at carrying heat, and the pressure would change the residence time of the gases. Adjusting these process variables along with the passage size for the flow distribution through the transparent showerhead may contribute to controlling the temperature profile across the substrate to be uniform or non-uniform at desired locations on the substrate 308, thereby preferentially treating the substrate 308 and films thereon. In some embodiments, gases may be injected at different regions within the processing chamber 400.

UV curing may have various uses such as for film repair and breaking hydrogen bonds in a film to increase the strain energy of the film. The processing chamber 400 may also be used for injecting UV activated gaseous species into the processing region 300 for forming films on the substrate 308. Specific gases may be mixed above the substrate 308 where a reaction can be activated in the gaseous phase using UV light and enabling a "drop-on" deposition process. In another embodiment, the gases may react with UV light to be used as a catalyst for forming a film on the substrate 308. Thus, the gas supply 600 may also include precursors and non-reactive gases that may be initiated with UV light for forming a film. In some embodiments, the window 412 and showerhead 414 may need to be cooled or at least not heated to prevent depositing a film on them. However, an ozone clean process may be initiated to remove any such film deposits from the window 412 and showerhead 414. Additionally, gases may be brought in uniformly to either create a mono-layer or a multi-layer film on the substrate. UV energy may then be used to activate a reaction on the substrate 308 to further form the deposited layers as desired.

Embodiments of the invention improve the temperature uniformity of the substrate by 2-3 times and the vacuum window is more effectively cleaned. The throughput of this system is increased because it allows for higher efficiency of both cleaning and curing processes. In some cases, the improved cure time is reduced by as much as 10-15%, believed to be a result of the more uniform temperatures of the substrate 308, not having a cold spot within the chamber or on the substrate 308, and keeping the window cleaner to reduce different light intensities across the window surface caused by build-up of deposited residues. Additionally, the amount of gas required to flow through processing chamber may be reduced because of more effective use of the gas.

While the foregoing is directed to embodiments of the invention, other and further embodiments of the invention may be devised without departing from the basic scope thereof.

What is claimed is:

1. A processing tool, comprising:
   an ultraviolet processing chamber defining a processing region;
   a substrate support for supporting a substrate within the processing region;
   an ultraviolet (UV) radiation source spaced apart from the substrate support and configured to generate and transmit ultraviolet radiation to a substrate positioned on the substrate support;
   a window disposed between the UV radiation source and the substrate support;
   a transparent showerhead disposed within the processing region between the window and the substrate support and defining an upper processing region and a lower processing region, the upper processing region located between the window and the transparent showerhead and the lower processing region located between the transparent showerhead and the substrate support, the transparent showerhead having one or more transparent showerhead passages between the upper and lower processing regions;
   a gas distribution ring having one or more gas distribution ring passages between a gas distribution ring inner channel within the gas distribution ring and the upper processing region; and
   a gas outlet ring positioned below the gas distribution ring, the gas outlet ring having one or more gas outlet passages between a gas outlet ring inner channel within the gas outlet ring and the lower processing region.

2. The processing tool of claim 1, wherein the one or more gas outlet passages are disposed below the transparent showerhead.

3. The processing tool of claim 1, further comprising:
a gas supply coupled with the gas distribution ring; and
a gas pump coupled with the gas outlet ring.

4. The processing tool of claim 1, wherein the gas distribution ring further comprises:
   a base distribution ring defining the one or more gas distribution ring passages, and
   a gas inlet ring coupled with the base distribution ring which together define the gas distribution ring inner channel, the gas inlet ring further comprising one or more gas inlets for gas to enter the gas distribution ring inner channel.

5. The processing tool of claim 1, wherein the gas outlet ring further comprises:
   a gas pumping ring defining the one or more gas outlet passages; and
   a base outlet ring coupled with the gas pumping ring which together define the gas outlet ring inner channel, the base outlet ring further comprising at least one gas outlet for gas to exit the gas outlet ring.

6. The processing tool of claim 5, wherein the gas pumping ring supports the transparent showerhead.

7. The processing tool of claim 1, wherein the one or more transparent showerhead passages have a uniform flow profile wherein the gas flow per radial area across the substrate is uniform.

8. The processing tool of claim 1, wherein the one or more transparent showerhead passages have a preferential flow profile wherein the gas flow per radial area is preferential to either a center or an edge of the substrate.

9. The processing tool of claim 3, further comprising:
   an ozone generation source located remotely from the processing region; and
   the gas supply coupling the ozone generation source to the processing region.

* * * * *